US010595446B2

(12) United States Patent
Chou et al.

(10) Patent No.: US 10,595,446 B2
(45) Date of Patent: Mar. 17, 2020

(54) OPTIMIZED AND INTELLIGENT FAN CONTROL MECHANISM INSIDE RACK SYSTEM

(71) Applicant: Quanta Computer Inc., Taoyuan (TW)

(72) Inventors: Le-Sheng Chou, Taoyuan (TW); Chao-Jung Chen, Taoyuan (TW); Tien-Jung Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 561 days.

(21) Appl. No.: 15/049,966

(22) Filed: Feb. 22, 2016

(65) Prior Publication Data

US 2017/0245399 A1    Aug. 24, 2017

(51) Int. Cl.
*H05K 7/20* (2006.01)
*F04B 49/06* (2006.01)

(52) U.S. Cl.
CPC ......... *H05K 7/20836* (2013.01); *H05K 7/207* (2013.01); *H05K 7/20136* (2013.01); *H05K 7/20209* (2013.01); *H05K 7/20572* (2013.01); *H05K 7/20736* (2013.01); *F04B 49/065* (2013.01)

(58) Field of Classification Search
CPC .............. H05K 7/20836; H05K 7/207; H05K 7/20572; H05K 7/20736; H05K 7/20136; H05K 7/20209; F04B 49/065
See application file for complete search history.

(56) References Cited

U.S. PATENT DOCUMENTS

2006/0168975 A1* 8/2006 Malone ............. H05K 7/20836
62/180
2007/0293137 A1   12/2007 Crippen et al.
(Continued)

FOREIGN PATENT DOCUMENTS

CN    102817862 A    12/2012
EP       2506697       3/2012
(Continued)

OTHER PUBLICATIONS

Japanese Office Action for Application No. 2017-026826, dated Oct. 17, 2017, w/ First Office Action Summary.
(Continued)

*Primary Examiner* — Charles G Freay
(74) *Attorney, Agent, or Firm* — Nixon Peabody LLP; Zhou Lu

(57) ABSTRACT

Disclosed are a system, method, and computer-readable medium for optimizing a fan control system inside a rack system. In at least one example embodiment, the system can include a rack server with a plurality of chassis each having at least one node, each of the nodes including at least one adjustable air vent and configured for adjusting the at least one adjustable air vent based on an air flow requirement of the node. The system can further include a plurality of fans, where the plurality of fans are configured to operate based on a control signal. The system also can comprise a fan control logic board, wherein the fan control logic board is configured to receive from each node in the plurality of chassis the air flow requirements and based on the plurality of air flow requirements generate and transmit the control signal to the plurality of fans.

20 Claims, 5 Drawing Sheets

(56) References Cited

U.S. PATENT DOCUMENTS

| | | |
|---|---|---|
| 2009/0056359 A1 | 3/2009 | Germagian |
| 2010/0085707 A1 | 4/2010 | Moss |
| 2010/0296945 A1* | 11/2010 | Nitta .................... G06F 1/206 417/2 |
| 2010/0315770 A1* | 12/2010 | Tipley .................... G06F 1/20 361/679.47 |
| 2010/0317278 A1 | 12/2010 | Novick |
| 2011/0160916 A1 | 6/2011 | Bahali et al. |
| 2011/0235272 A1* | 9/2011 | Bash ................ H05K 7/20609 361/692 |
| 2012/0247750 A1 | 10/2012 | Kobayashi et al. |
| 2013/0083481 A1* | 4/2013 | Goto ................ H05K 7/20209 361/695 |
| 2013/0273825 A1* | 10/2013 | Uno ................ H05K 7/20745 454/184 |
| 2013/0289793 A1* | 10/2013 | Pan .................... G05B 13/02 700/300 |
| 2013/0295834 A1 | 11/2013 | Faist et al. |
| 2014/0150480 A1 | 6/2014 | Kodama |
| 2015/0071646 A1 | 3/2015 | Jau et al. |
| 2015/0192937 A1 | 7/2015 | Govindarajan et al. |

FOREIGN PATENT DOCUMENTS

| | | |
|---|---|---|
| EP | 2506697 A2 | 10/2012 |
| JP | 2012212720 A | 11/2012 |
| TW | 201344058 A | 11/2013 |
| TW | 201511659 A | 3/2015 |
| WO | 2015050521 A1 | 4/2015 |

OTHER PUBLICATIONS

Extended European Search Report for EP Application No. 17157271.2, dated Jul. 3, 2017, w/ Search Report Summary.

Taiwanese Office Action for Application No. 105114084, dated May 17, 2017, w/ First Office Action Summary.

Taiwanese Search Report for Application No. 105114084 (dated May 16, 2017) mailed with First Office Action dated May 17, 2017.

* cited by examiner

OPTIMIZED AND INTELLIGENT FAN CONTROL MECHANISM INSIDE RACK SYSTEM

FIELD OF THE INVENTION

The subject matter herein generally relates to a fan cooling system of nodes. More specifically, the subject matter herein relates to optimizing a fan cooling system based on the processing loads of the nodes.

BACKGROUND

A server rack can include a plurality of nodes (e.g., rackservers). In order to prevent the plurality of nodes from overheating and failing, the nodes can be cooled by a shared fan cooling system. Shared fan cooling system attempt to cool the plurality of nodes as a single unit. That is, a server rack temperature is taken and the shared fan cooling system operates based on the server rack temperature. However, each node has an independent temperature. The independent temperature of a single node can be affected by the node's operating capacity. Nodes can operate at different capacities. The capacities can be based on CPU utilization. For example, a node can be idle (i.e., less than 2 percent processing capacity used), light (i.e., between 2 and 30 percent processing capacity used), medium (i.e., between 31 and 65 percent processing capacity used), or heavy (i.e., between 66 and 100 percent capacity used). Thus, a shared fan cooling system that takes each node into consideration is needed.

SUMMARY OF THE INVENTION

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are a system, method, and computer-readable medium for optimizing a fan control system inside a rack system. In at least one example embodiment, the system can include a rack server with a plurality of chassis each having at least one node, each of the nodes including at least one adjustable air vent and configured for adjusting the at least one adjustable air vent based on an air flow requirement of the node. The system can further include a plurality of fans, wherein the plurality of fans are configured to operate based on a control signal. The system also can include a fan control logic board, wherein the fan control logic board is configured to receive from each node in the plurality of chassis the air flow requirements and based on the plurality of air flow requirements generate and transmit the control signal to the plurality of fans.

In at least one example embodiment, the system can include that when the air flow requirement of the node is idle the air vent is closed, that when the air flow requirement of the node is heavy the air vent is open, and that when the air flow requirement of the node is greater than idle and less than heavy the air vent is opened according to a ratio. In at least one example embodiment, the airflow requirement of each node can be a pulse-width modulation signal.

In at least one example embodiment, the control signal can be generated by averaging the received airflow requirements. In another embodiment, the control signal can be generated by taking the median of the received airflow requirements.

The method and computer-readable medium for optimizing a fan control system inside a rack system can include similar embodiments to the system described above.

BRIEF DESCRIPTION OF THE DRAWINGS

Various embodiments in accordance with the present disclosure will be described with reference to the drawings, in which.

DETAILED DESCRIPTION

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Several definitions that apply throughout this disclosure will now be presented. The term "coupled" is defined as connected, whether directly or indirectly through intervening components, and is not necessarily limited to physical connections. The term "comprising" means "including, but not necessarily limited to"; it specifically indicates open-ended inclusion or membership in a so-described combination, group, series and the like.

The disclosed technology addresses the need in the art for controlling the fans used to cool a plurality of nodes in a rack based on the determined cooling requirements of each node. A node can determine a cooling requirement based on a processing load, temperature, and/or air vent status. A fan control logic board can receive the cooling requirements and based on the received cooling requirements intelligently control the fans of the server rack. For example, where multiple nodes are idle (with air vents closed), the remaining active nodes will require less fan output for adequate cooling (even with heavy processing loads) since airflow will be diverted from the idle nodes to the active nodes, thus saving power consumption.

Figure 1:
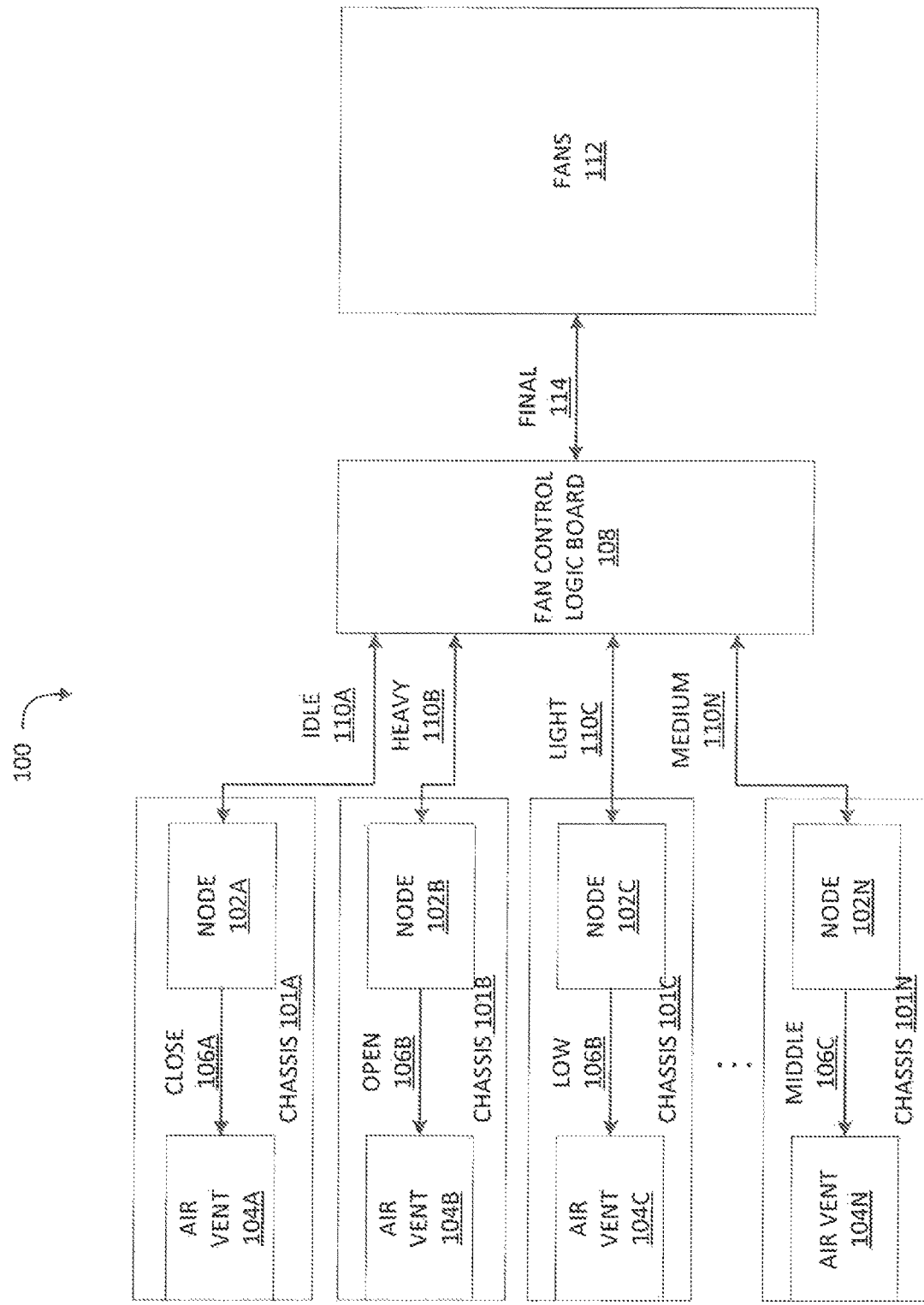
FIG. 1 is a block diagram of an example fan control system.

FIG. 1 illustrates an example rack 100 implementing a fan control system in accordance with the present technology. Rack 100 include a plurality of chassis 101A, 101B, 101C, . . . 101N (collectively "101"). The chassis 101 can each include nodes 102A, 102B, 102C, . . . 102N (collectively "102") coupled to a plurality of air vents 104A, 104B, 104C, . . . 104D (collectively "104"), respectively. Air vents 104 can be used to regulate airflow from fans 112 to nodes 102. Nodes 102 can send control signals 106 to corresponding air vents 104, respectively. The control signals 106 can actuate air vents 104. For example, an open control signal can cause the corresponding air vent to open. A close control signal can cause the corresponding air vent to close. In other embodiments, the control signal can indicate other positions between open and close (e.g., a ratio, percentage, etc.). For example, a ratio control signal can be sent. In response to receiving the ratio control signal the corresponding air vent can actuate to the ratio. For example, when a ratio is 2/3 the air vent can be two thirds open. When a ratio is 1/2 the air vent can be half way opened. When the ratio is 1/3 the air vent can be one third open. In other embodiments, there can be more than one air vent in each chassis, and each air vent can be individually closed (or opened) to reduce airflow.

The control signal generated by nodes 102 can be based on the processing load of the node. For example, when node 102A is idle (i.e., almost no processing load), the control signal can be close signal 106A. In response to receiving close control signal 106A, air vent 104A can close. Since the node is idle, it does not require a large amount of airflow for cooling purposes, thus the air vent can be closed and allow airflow from fans 112 to be instead directed through the other chassis. In another example, when node 102B has a heavy processing load, the control signal can be open control signal 106B. In response to receiving open control signal 106B, air vent 104B can be fully open. Since the node is under a heavy processing load, the node requires a large amount of airflow for cooling purposes, thus the air vent can be opened to ensure that a maximum airflow is directed through the chassis. In another example, when node 102C has a light load, the control signal can be low ratio control signal 106C (e.g., 1/3 ratio). In response to receiving low ratio control signal 106C, air vent 104C can partially open (e.g., one-third open). Since the node has a light load, the node requires a low airflow for cooling purposes, thus the air vent can be partially opened to limit the amount of airflow to that needed and allow airflow to be directed into other chassis with greater loads. In a final example, when node 102N has a middle load, the control signal can be middle ratio control signal 106N (e.g., 1/2 ratio). In response to receiving middle ratio control signal 106N, air vent 104N can partial open (e.g., one-half open). Since the node has a middle load, the node requires some airflow for cooling purposes, thus the air vent can be halfway opened.

In other embodiments, the control signals can be determined by fan control logic board 108. For example, fan control logic board 108 can receive from nodes 102 corresponding processing loads. In response, fan control logic board 108 can determine and transmit a control signal for adjusting the air vents for each chassis based on the corresponding processing loads. Moreover, based on the collective processing loads, the fan control logic board 108 may be able to determine a more beneficial adjustment for the various air vents than each node could accomplish separately.

As noted above, rack 100 can also include fan control logic board 108. Fan control logic board 108 can be configured to control fans 112. Fan control logic board 108 can receive from nodes 102 an indication of how much cooling nodes 102 require (e.g., based on the current processing loads and the current airflow through air vents 106). For example, node 102A can send an idle signal (e.g., a minimal width pulse wave signal) to the fan control logic board 108 indicating limited airflow is required based on an idle processing load and a closed air vent 104A; node 102B can send a heavy signal (e.g., a long width pulse wave signal) indicating a heavy air flow is required based on a heavy processing load and open air vent 104B; node 102C can send a light signal (e.g., a short width pulse wave signal) indicating a light airflow is required based on a light processing load and a partial opened air vent 104C; and node 102N can send a medium signal (e.g., a medium width pulse wave signal) indicating a medium airflow is required based on a medium processing load and a partial opened air vent 104N. The pulse wave signals can proportionally correlate to the corresponding airflow that is required to adequately cool the node. Fan control logic board 108 can calculate based on the received signals a final pulse wave signal 114. In some embodiments, the final pulse wave can simply be the pulse wave based on the processing load signal associated with the largest load. In other embodiments, the final pulse wave signal can be an average of the received processing load signals. In other embodiments, the final pulse wave signal can be a median of the received processing load signals.

In another example, if air vents 104A, 104C, and 104B of corresponding nodes 102A, 102C and 102N are all closed, the airflow from fans 112 will be pushed through open air vent 104B of node 102B. As a result, node 102B will be cooled more than typically expected when all air vents 104 are opened. As a result, the extra airflow to node 102B lowers the temperature of node 102B to below what is required for adequate cooling. Thus, the final signal 114 can indicate fans 112 can lower the fan speed and still adequately cool node 102B, while it maintains a heavy processing load.

Once the proper pulse wave is determined, the fan control logic board 108 can send the final pulse wave signal to fans 112. In response to receiving the final pulse wave signal, fans 112 can operate based on the final pulse wave signal. For example, when the final pulse wave signal is a long width, fans 112 can operate on a high airflow output. In another example, when the final pulse wave signal is a short width, fans 112 can operate on a low airflow output. In other examples, the final pulse wave signal can be a ratio, and in response fans 112 can operate on an airflow output in relation to the ratio.

The combined result of the control of the air vents and the control of the fans discussed above is that there is provided a fan control system in rack 100 that is self-regulating and reduces power consumption. For example when an air vent of a chassis is closed, more airflow will be delivered to other chassis, decreasing the temperature of the nodes in these other chassis. In response to receiving more airflow (i.e., based on more airflow being directed to the other nodes), these remaining nodes are cooled more quickly and thus require less airflow from the fans. Accordingly, the remaining nodes can signal the control logic to set the fans to blow at a lower speed, thus maintain the required temperature and processing loads at the nodes in these remaining chassis while lowering overall power consumption.

Figure 2:
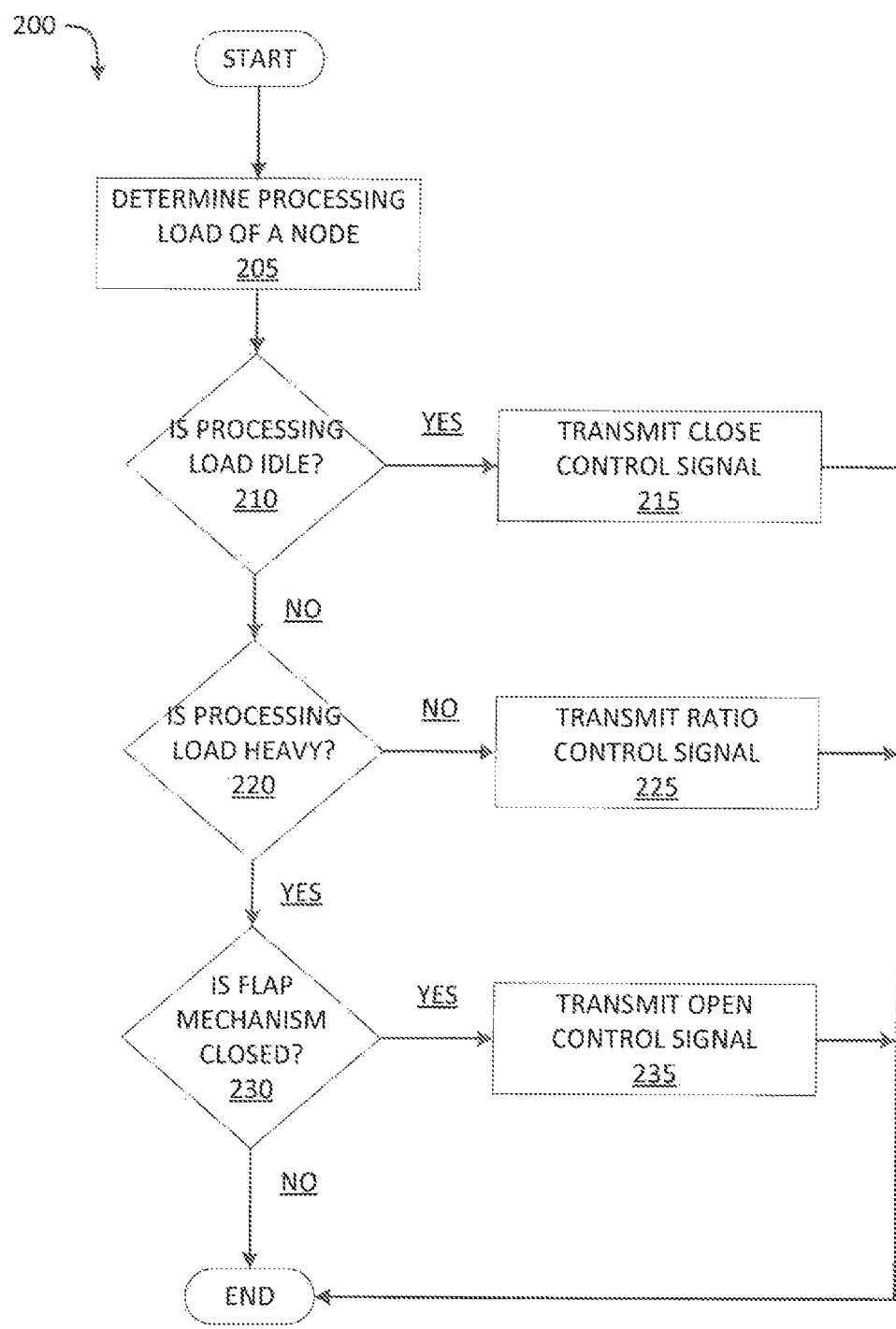
FIG. 2 is a flow diagram illustrating an example method of controlling an air vent.

Now turning to FIG. 2, there is shown a method for controlling air vents in accordance with the present technology. The method illustrated in FIG. 2 is provided by way of example, as there are a variety of ways to carry out the method. Additionally, while the example method is illustrated with a particular order of steps, those of ordinary skill in the art will appreciate that FIG. 2 and the steps illustrated therein can be executed in any order that accomplishes the technical advantages of the present disclosure and can include fewer or more steps than illustrated.

Each step shown in FIG. 2 represents one or more processes, methods or subroutines, carried out in example method. The steps illustrated in FIG. 2 can be implemented in a system illustrated in FIG. 1. The flow diagram illustrated in FIG. 2 will be described in relation to and make reference to at least nodes 102 and air vents 104 of FIG. 1.

Method 200 can begin at step 205. At step 205, a node (e.g., 102) can determine a processing load. For example, a node can determine the processing load by the percentage of one or more central processing unit (CPU) utilization and/or memory consumption. In some examples, a current temperature of the node can be used to determine the processing load. A high temperature can indicate a high processing load and a low temperature can indicate a low processing load. In some examples, the current temperature can be used to supplement the percentage of CPU utilization and/or memory consumption. For example, a medium percentage of CPU utilization and medium memory consumption, along with a high temperature can equate to a high processing load. When the processing load has been determined, method 200 can proceed to step 210.

At step 210, a determination can be made if the processing load is idle. For example, when the node (e.g., 102A) is not currently in use (i.e., below two percent of usage or powered down) the node can be idle. When the node is idle, method 200 can proceed to step 215. When the node is not idle, method 200 can proceed to step 220.

At step 215, the node (e.g., 102A) can transmit a close control signal to a corresponding air vent (e.g., 104A). In response to receiving the close control signal, the air vent can close (i.e., restricting airflow to the node). In some examples, the close control signal can be transmitted from the fan control logic board (e.g., 108). When the close control signal has been transmitted, method 200 can resume previous processing, including repeating method 200.

At step 220, a determination can be made if the processing load is heavy. For example, when the node (e.g., 102B) currently has high percentage of utilization (e.g., over 65 percent of usage and memory consumption) the node can be under heavy processing load. The heavy processing load can also be determined by the temperature of the node. When the node does not have a heavy load, the method can proceed to step 225. When the node does have a heavy load, the method can proceed to step 230.

At step 225, the node (e.g., 102C or 102N) can transmit a ratio control signal to a corresponding air vent (e.g., 104C or 104N). In response to receiving the ratio control signal, the air vent can open a percentage of the ratio (i.e., partially restricting airflow to the node). The ratio control signal can be determined based on the percentage of CPU and memory utilization. For example, when a node (e.g., 102C) has a light load (e.g., 33% utilization) the ratio can open relative to the percentage (e.g., 1/3) and the air vent (e.g., 104C) can be one-third opened. In another example, when a node (e.g., 102N) has a medium load (e.g., 66% utilization) the ratio can relative to the percentage (e.g., 2/3) and the air vent (e.g., 104N) can be two-third opened. In some examples, the ratio control signal can be transmitted from the fan control logic board (e.g., 108). When the ratio control signal has been transmitted, method 200 can resume previous processing, including repeating method 200.

At step 230, a determination can be made if the air vent (104B) is closed. If the air vent is closed, method 200 can proceed to step 235. If the air vent is not closed, method 200 can resume previous processing, including repeating method 200.

At step 235, node (e.g., 102B) can transmit an open control signal to a corresponding air vent (e.g., 104B). In response to receiving the open control signal, the air vent can open (i.e., unrestricting airflow to the node). In some examples, the open control signal can be transmitted from the fan control logic board (e.g., 108). When the close control signal has been transmitted, method 200 can resume previous processing, including repeating method 200.

Figure 3:
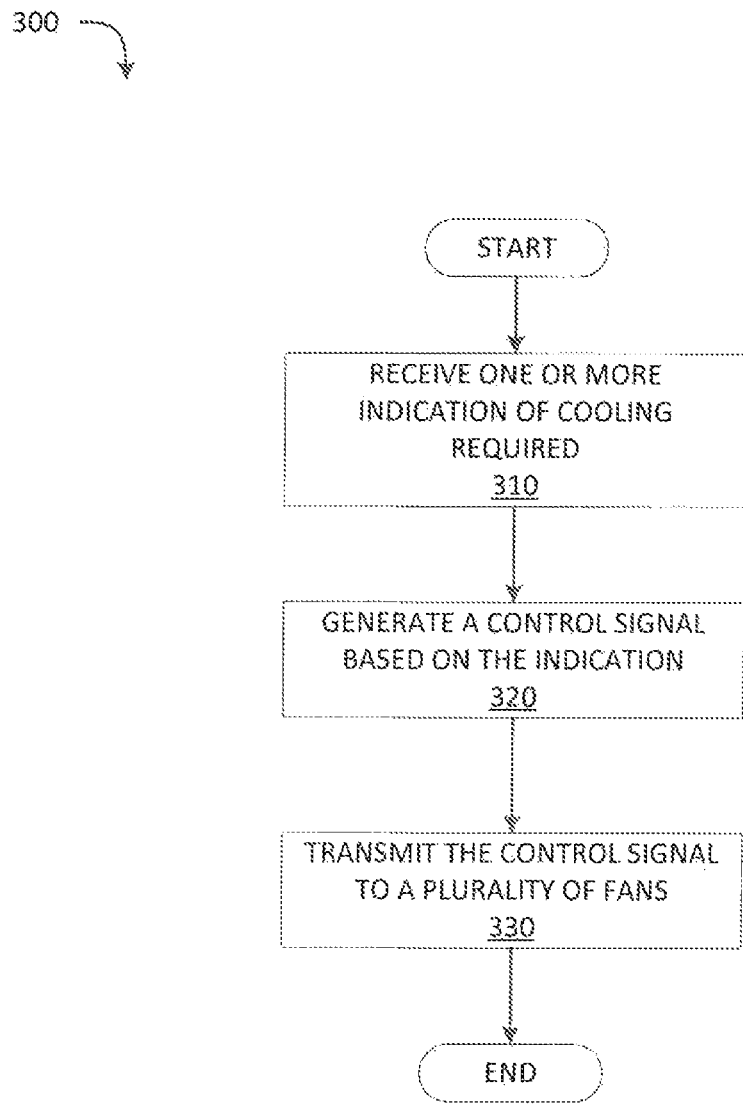
FIG. 3 is a flow diagram illustrating an example method of controlling a shared fan system.

Now turning to FIG. 3, there is shown a method for controlling a shared fan system in accordance with the present technology. The method illustrated in FIG. 3 is provided by way of example, as there are a variety of ways to carry out the method. Additionally, while the example method is illustrated with a particular order of steps, those of ordinary skill in the art will appreciate that FIG. 3 and the steps illustrated therein can be executed in any order that accomplishes the technical advantages of the present disclosure and can include fewer or more steps than illustrated.

Each step shown in FIG. 3 represents one or more processes, methods or subroutines, carried out in example method. The steps illustrated in FIG. 3 can be implemented in a system illustrated in FIG. 1. The flow diagram illustrated in FIG. 3 will be described in relation to and make reference to at least nodes 102, fan control logic board 108, and fans 112 of FIG. 1.

Method 300 can begin at step 310. At step 310 a fan control logic board (e.g., 108) can receive a one or more indications of cooling required (e.g., pulse-width modulation signals) from one or more nodes 102. The indications can be determined by the nodes based on at least one of a current temperature reading, processing load (e.g., idle, low, medium, heavy, etc.) and air vent states (e.g., open, closed, partially opened, etc.). For example, fan control logic board (e.g., 108) can receive an idle signal (e.g., 110A from node 102A), a heavy signal (e.g., 110B from node 102B), a light signal (e.g., 110C from node 102C), and a medium signal (e.g. 110N from node 102N). Optionally in some embodiments, fan control logic board 108 can also receive, an air vent closed state (e.g., 106A from node 102A), an air vent open state (e.g., 106B from node 102B), an air vent low state (e.g., 106C from node 102C), and an air vent middle state (e.g., 106N from node 102N). When the fan control logic board has received a one or more indications of cooling required, method 300 can proceed to step 320.

At step 320, the fan control logic board (e.g., 108) can generate a control signal for the fans. The control signal can be based on the received indications of cooling required and, optionally, the air vent states. Fan control logic board (e.g., 108) can determine a pulse-width modulation control signal for optimal cooling of the plurality of nodes (e.g., 102). For example, the final pulse wave can simply be the pulse wave based on the processing load signal associated with the largest load. For example, fan control logic board (e.g., 108) can calculate the average of the pulse-width modulation signals (e.g., processing loads) received to generate an average pulse-width modulation control signal. In other examples, fan control logic board (e.g., 108) can calculate the median of the pulse-width modulation signals (e.g., processing loads) received to generate a median pulse-width modulation control signal. When the final pulse-width module control signal has been created, method 300 can proceed to step 330.

At step 330, fan control logic board (e.g., 108) can transmit the final pulse-width modulation control signal to a plurality of fans (e.g., 112). In response to receiving the final pulse-width modulation control signal, the fans (e.g., 112) can increase or decrease the revolutions per minute of one or more fans, and power up or power down one or more fans. In some examples, the plurality of fans (e.g., 112) can be one or more banks of fans. The one or more banks of fans can be operated independently, in accordance with the final pulse-width modulation control signal. When the final pulse-width modulation control signal has been transmitted, method 300 can end.

Figure 4A:
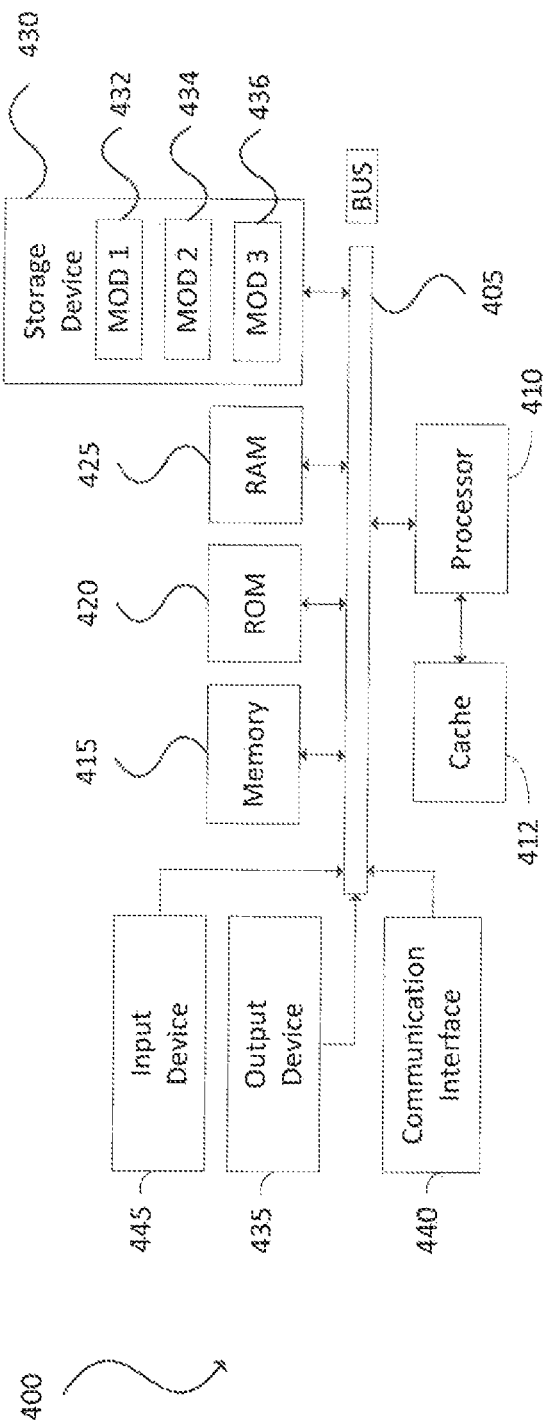
FIG. 4A shows an example system embodiment for implementing various embodiments of the present technology.
Figure 4B:
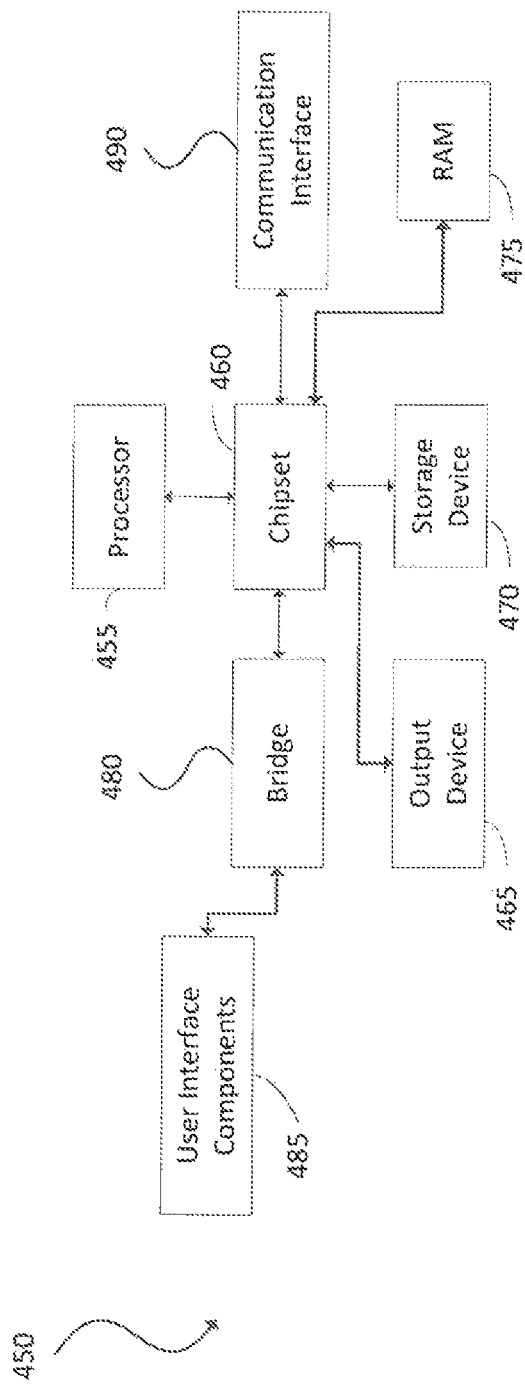
FIG. 4B shows an example system embodiment for implementing various embodiments of the present technology.

Although the foregoing exemplary embodiments illustrate methods performed by specific types of components, the present disclosure contemplates that the methods described above can be implements via other types of devices, such as a computing system or the like. For example, FIG. 4A and FIG. 4B show example possible system embodiments. The more appropriate embodiment will be apparent to those of ordinary skill in the art when practicing the present technology. Persons of ordinary skill in the art will also readily appreciate that other system embodiments are possible.

FIG. 4A illustrates a conventional system bus computing system architecture 400 wherein the components of the system are in electrical communication with each other using a bus 405. Example system 400 includes a processing unit (CPU or processor) 410 and a system bus 405 that couples various system components including the system memory 415, such as read only memory (ROM) 420 and random access memory (RAM) 425, to the processor 410. The system 400 can include a cache of high-speed memory connected directly with, in close proximity to, or integrated as part of the processor 410. The system 400 can copy data from the memory 415 and/or the storage device 430 to the cache 412 for quick access by the processor 410. In this way, the cache can provide a performance boost that avoids processor 410 delays while waiting for data. These and other modules can control or be configured to control the processor 410 to perform various actions. Other system memory 415 can be available for use as well. The memory 415 can include multiple different types of memory with different performance characteristics. The processor 410 can include any general purpose processor and a hardware module or software module, such as module 1 432, module 2 434, and module 3 436 stored in storage device 430, configured to control the processor 410 as well as a special-purpose processor where software instructions are incorporated into the actual processor design. The processor 410 can essentially be a completely self-contained computing system, containing multiple cores or processors, a bus, memory controller, cache, etc. A multi-core processor can be symmetric or asymmetric.

To enable user interaction with the computing device 400, an input device 445 can represent any number of input mechanisms, such as a microphone for speech, a touch-sensitive screen for gesture or graphical input, keyboard, mouse, motion input, speech and so forth. An output device 435 can also be one or more of a number of output mechanisms known to those of skill in the art. In some instances, multimodal systems can enable a user to provide multiple types of input to communicate with the computing device 400. The communications interface 440 can generally govern and manage the user input and system output. There is no restriction on operating on any particular hardware arrangement and therefore the basic features here can easily be substituted for improved hardware or firmware arrangements as they are developed.

Storage device 430 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 425, read only memory (ROM) 420, and hybrids thereof.

The storage device 430 can include software modules 432, 434, 436 for controlling the processor 410. Other hardware or software modules are contemplated. The storage device 430 can be connected to the system bus 405. In one aspect, a hardware module that performs a particular function can include the software component stored in a computer-readable medium in connection with the necessary hardware components, such as the processor 410, bus 405, display 435, and so forth, to carry out the function.

FIG. 4B illustrates a computer system 450 having a chipset architecture that can be used in executing the described method and generating and displaying a graphical user interface (GUI). Computer system 450 is an example of computer hardware, software, and firmware that can be used to implement the disclosed technology. System 450 can include a processor 455, representative of any number of physically and/or logically distinct resources capable of executing software, firmware, and hardware configured to perform identified computations. Processor 455 can communicate with a chipset 460 that can control input to and output from processor 455. In this example, chipset 460 outputs information to output 465, such as a display, and can read and write information to storage device 470, which can include magnetic media, and solid state media, for example. Chipset 460 can also read data from and write data to RAM 475. A bridge 480 for interfacing with a variety of user interface components 485 can be provided for interfacing with chipset 460. Such user interface components 485 can include a keyboard, a microphone, touch detection and processing circuitry, a pointing device, such as a mouse, and so on. In general, inputs to system 450 can come from any of a variety of sources, machine generated and/or human generated.

Chipset 460 can also interface with one or more communication interfaces 490 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by processor 455 analyzing data stored in storage 470 or 475. Further, the machine can receive inputs from a user via user interface components 485 and execute appropriate functions, such as browsing functions by interpreting these inputs using processor 455.

It can be appreciated that example systems 400 and 450 can have more than one processor 410 or be part of a group or cluster of computing devices networked together to provide greater processing capability.

For clarity of explanation, in some instances the present technology can be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions can be, for example, binaries, intermediate format instructions such as assembly language, firmware, or source code. Examples of computer-readable media that can be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A rack system comprising:
   a plurality of chassis each having one node, one adjustable air vent and being configured for adjusting the adjustable air vent based on an airflow requirement for the node;
   a plurality of fans, wherein the plurality of fans is being configured to operate based on a first control signal; and
   a fan control logic board, wherein the fan control logic board is configured to receive from each of the plurality of chassis the airflow requirement of the associated node, and, based on the airflow requirement of the associated node, generate and transmit a second control signal to the adjustable air vent of the associated chassis.

2. The rack system of claim 1, wherein, for a given chassis of the plurality of chassis, when the airflow requirement of the associated node is idle, the adjustable air vent of the given chassis is closed.

3. The rack system of claim 1, wherein, for a given chassis of the plurality of chassis, when the airflow requirement of the associated node is heavy, the adjustable air vent of the given chassis is open.

4. The rack system of claim 1, wherein, for a given chassis of the plurality of chassis, when the airflow requirement of the associated node is greater than idle and less than heavy, the adjustable air vent of the given chassis is opened according to a ratio that is a percentage of the air vent being open.

5. The rack system of claim 1, wherein the airflow requirement of each of the plurality of nodes is represented by a pulse-width modulation signal.

6. The rack system of claim 1, wherein the first control signal is generated by averaging the received airflow requirements.

7. The rack system of claim 1, wherein the first control signal is generated by taking the median of the received airflow requirements.

8. A method of controlling fans inside a rack system, the method comprising:
   receiving, at a fan control logic board of the rack system, an airflow requirement from each of a plurality of nodes in the rack system, wherein each airflow requirement indicates a level of airflow needed to adequately cool the corresponding node;
   generating and transmitting an air vent control signal for each of the received airflow requirements of each of the plurality of nodes, wherein the fan control logic board is configured to generate and transmit each air vent control signal to an adjustable air vent associated with each node; and
   generating and transmitting a fan control signal based on the received airflow requirements from each of the plurality of nodes to the fans inside the rack system.

9. The method of claim 8, wherein, for a given node when the airflow requirement of the associated node is idle, the air vent control signal is a close signal.

10. The method of claim 8, wherein, for a given node when the airflow requirement of the associated node is heavy, the air vent control signal is an open signal.

11. The method of claim 8, wherein, for a given node when the airflow requirement of the associated node is greater than idle and less than heavy, the air vent control signal represents a ratio that is a percentage of the air vent being open.

12. The method of claim 8, wherein the airflow requirement of each of the plurality of nodes is represented by a pulse-width modulation signal.

13. The method of claim 8, wherein the fan control signal is generated by averaging the received airflow requirements.

14. The method of claim 8, wherein the fan control signal is generated by taking the median of the received airflow requirements.

15. A non-transitory computer-readable medium containing instructions that, when executed by a fan control logic board for a rack system, causes the fan control logic board to:
   receive an airflow requirement from each of a plurality of nodes in the rack system, wherein each airflow requirement indicates a level of airflow needed to adequately cool the corresponding node;
   generate and transmit an air vent control signal for each of the received airflow requirements of each of the plurality of nodes, wherein the fan control logic board is configured to generate and transmit each air vent control signal to an adjustable air vent associated with each node; and
   generate and transmit a fan control signal based on the received airflow requirements from the nodes to the fans inside the rack system.

16. The non-transitory computer-readable medium of claim 15, wherein, for a given chassis of the plurality of chassis, when the airflow requirement of the associated node is idle, the air vent control signal is a close signal.

17. The non-transitory computer-readable medium of claim 15, wherein, for a given chassis of the plurality of chassis, when the airflow requirement of the associated node is heavy, the air vent control signal is an open signal.

18. The non-transitory computer-readable medium of claim 15, wherein, for a given chassis of the plurality of chassis, when the airflow requirement of the associated node is greater than idle and less than heavy, the air vent control signal represents a ratio that is a percentage the air vent being open.

19. The non-transitory computer-readable medium of claim 15, wherein the fan control signal is generated by averaging the received airflow requirements.

20. The non-transitory computer-readable medium of claim 15, wherein the fan control signal is generated by taking the median of the received airflow requirements.

* * * * *